United States Patent [19]

Burnett

[11] Patent Number: 5,189,374
[45] Date of Patent: Feb. 23, 1993

[54] METHOD FOR PULSE PROPAGATION ANALYSIS OF A WELL CASING OR THE LIKE BY TRANSMITTED PULSE INTERACTION

[76] Inventor: Gale D. Burnett, 9191 Northwood Rd., Lynden, Wash. 98264

[21] Appl. No.: 782,559

[22] Filed: Oct. 25, 1991

[51] Int. Cl.⁵ .................. G01R 31/11; G01R 31/12
[52] U.S. Cl. .................. 324/534; 324/527; 324/532
[58] Field of Search ............. 324/527, 532, 533, 534, 324/535, 543; 379/2, 5, 24, 26, 30, 31

[56] References Cited

U.S. PATENT DOCUMENTS

| | | |
|---|---|---|
| 2,113,749 | 12/1935 | Statham. |
| 2,602,834 | 7/1952 | Leslie et al. . |
| 2,725,526 | 11/1955 | Stringfield et al. ............ 324/533 X |
| 2,887,652 | 5/1959 | Bendayan et al. . |
| 3,600,674 | 8/1971 | Roberts et al. . |
| 3,924,179 | 12/1975 | Dozier . |
| 4,063,161 | 12/1977 | Pardis . |
| 4,118,662 | 10/1978 | Weber . |
| 4,289,019 | 9/1981 | Claytor . |
| 4,291,204 | 9/1981 | Crick ........................... 324/534 X |
| 4,538,103 | 8/1985 | Cappon ......................... 324/534 |
| 4,739,276 | 4/1988 | Graube . |
| 4,755,742 | 7/1988 | Agoston et al. . |
| 4,970,467 | 11/1990 | Burnett ......................... 324/532 X |

Primary Examiner—Jack B. Harvey
Assistant Examiner—Diep Do
Attorney, Agent, or Firm—Hughes & Multer

[57] ABSTRACT

A method of analyzing an electrically conductive member, such as a well casing, where one end of the member is more accessible, and a second end of the member is less accessible. A first electrical pulse is transmitted along the well casing toward a lower end of the well casing, where the first pulse is reflected as a reflected pulse to travel back up the casing. A second pulse is transmitted down through the well casing to intersect with the reflected pulse, after which the reflected pulse is detected and analyzed to determine conditions along the well casing. The timing of the pulses its synchronized so that the point of intersection is stepped along the well casing.

12 Claims, 1 Drawing Sheet

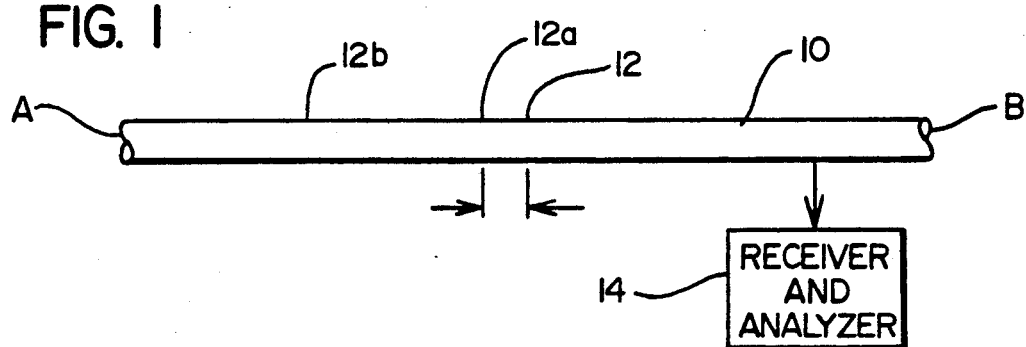
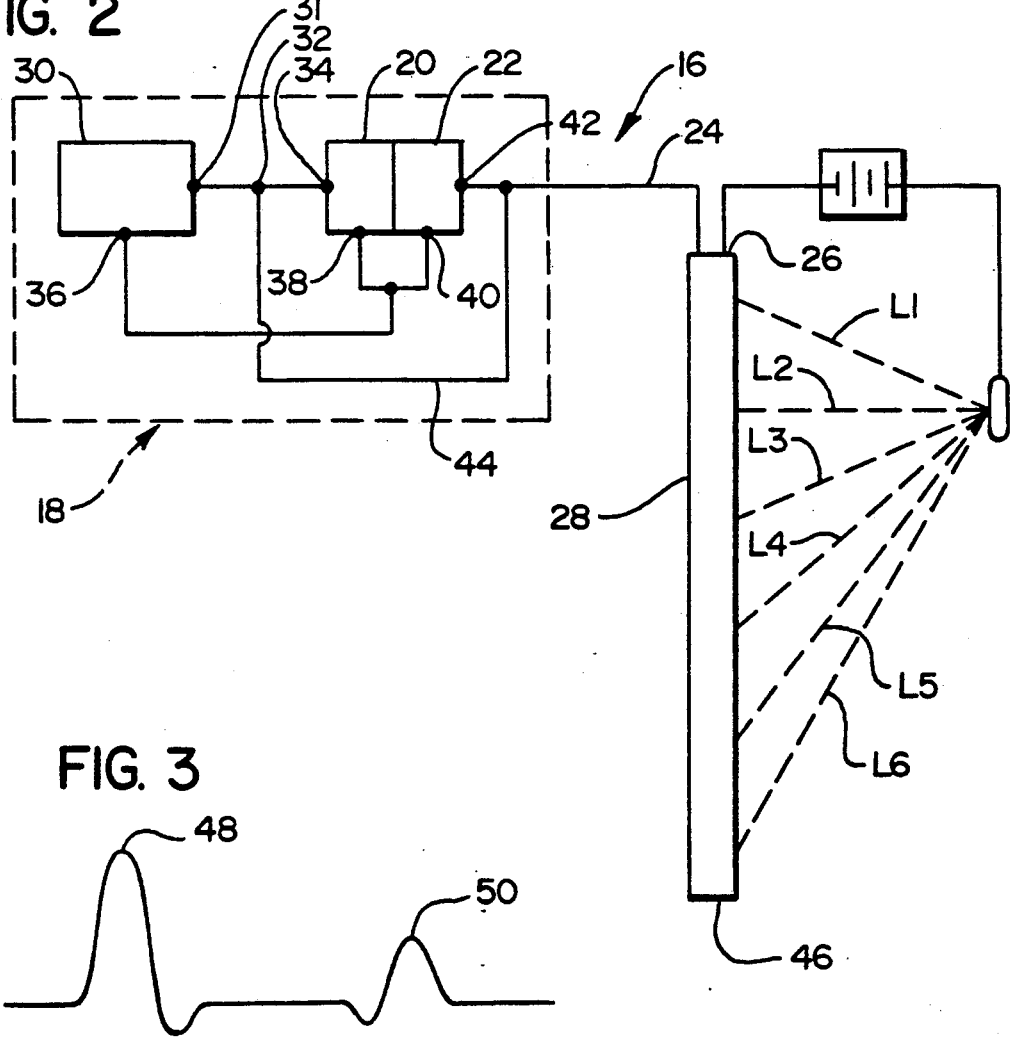

METHOD FOR PULSE PROPAGATION ANALYSIS OF A WELL CASING OR THE LIKE BY TRANSMITTED PULSE INTERACTION

CROSS REFERENCE TO RELATED APPLICATIONS

The present patent application is being filed concurrently with two other patent applications by the same inventor, these being entitled "APPARATUS AND METHOD FOR PULSE PROPAGATION ANALYSIS OF A PIPELINE OR THE LIKE" and "APPARATUS AND METHOD FOR PULSE PROPAGATION ANALYSIS". The subject matter of these two other patent applications is hereby incorporated by reference, since some of the teachings contained in these other two applications may be useful in connection with teachings of the present patent application.

FIELD OF THE INVENTION

The present invention relates to an apparatus and method for analyzing conditions along a length of an elongate electrically conductive member, and more particularly to such an apparatus and method which is particularly adapted to detect the presence and location of anomalies along the length elongate electrically member, such as a well casing, where end portions of the conductive member which is to be tested is not readily accessible.

BACKGROUND ART

In U.S. Pat. No. 4,970,467, issued Nov. 13, 1990, entitled "APPARATUS AND METHOD FOR PULSE PROPAGATION ANALYSIS OF A PIPELINE OF THE LIKE", the inventor of that patent being the same as the applicant in the present application, there was disclosed a system for ascertaining the existence and location of anomalies along the length of a member, such as a underground pipeline. In that system, electrical pulses are imparted to the pipeline at opposite ends of the portion to be tested, with these pulses being synchronized so that they intersect at predetermined locations along the length of the pipeline. The waveform or "fingerprint" from one of the pulses which has passed through the point of intersection is analyzed to determine the possibility of an anomaly being present at the location of the intersection.

The particular problem toward which U.S. Pat. No. 4,970,467 was directed was to detect faults in pipelines which carry oil or some other fluid underground and extend for possibly hundreds of miles.

Such pipelines are commonly made of metal (e.g., steel) which is wrapped with a protective layer of tape to prevent corrosion of the metal. Even so, the protective layer will sometimes deteriorate at certain locations, or possibly be abraded by some object (e.g., a rock which might come in contact with the protective layer) so as to expose the metal of the pipe to the adjacent ground, resulting in premature pipe corrosion.

In order to alleviate this corrosion of the pipeline, it is common to utilize a source of electrical direct current power to impart a negative charge to the pipeline relative to the adjacent ground. One method is to attach Galvanic anodes to the pipe (e.g. a magnesium anode). Another method is to provide a DC generator with the negative output being attached to the pipeline, while the positive output is connected to an electrode which is placed in the ground. However, this has its shortcomings. For example, there can be a localized interfering electrical field which may reverse the electrical potential between the pipeline and the ground within an area. This electrical field could result, for example, from an adjacent pipeline which might cross (or extend adjacent to) another pipeline.

Accordingly, the pipeline industry has undertaken to analyze the conditions along the length of the various pipelines to determine the electrical potential between the pipeline and the adjacent ground. The common method of doing this is what is termed the "half-cell" process, which has more or less become the standard of the industry. A typical half-cell comprises a containing member which is a sealed plastic cylinder with a porous ceramic plug. A solution of copper sulfate is in the container and there is a piece of copper which extends into the solution of copper sulfate, with this copper being in turn attached to a wire which is then attached to a volt meter. The other lead of the volt meter would lead to a connection to the actual pipe itself. A somewhat crude method of taking half-cell readings would be to walk along the length of the pipe, dig a hole at selected locations to expose the pipe, attach one electrode to the pipe, and then stick the half-cell in the ground at that location to take a reading. Then the person would proceed to the next location along the pipeline and repeat the same process. However, there are more effective methods of accomplishing this. One method is to connect one end of a cable to the pipe at one location, and have the length of the cable wound on a rotating drum which is in turn mounted to a truck. The truck is then driven down the length of the pipeline for a few miles, with the half-cell being placed in the ground at various locations along the length of the pipeline.

When one realizes that pipelines extend beneath freeways, underneath rivers, underneath the ocean floor, and through other areas of difficult access, it can be seen that there are practical problems in employing the half-cell method. Nevertheless, the half-cell method has in a sense become the standard of the industry, and substantial work has been done in analyzing the data gathered through the half-cell method and correlating this to the condition of pipelines in the soil. The net effect is that there has been for many years a growing problem of substantial magnitude in effective detection of pipeline defects. In the United States alone, there is a vast network of pipelines extending along various routes, and there are conferences held between the various owners/operators of such pipelines to resolve the problems associated with these pipelines (e.g., the electrical field of one pipeline affecting another pipeline adversely). Also, the increasing sensitivity to environmental considerations associated with pipeline leaks is of greater concern. Further, the economic considerations of proper maintenance and functioning of these pipelines is significant.

Somewhat similar problems exist with regard to analyzing well casings, such as oil well casings which can extend thousands of feet downwardly into the earth. However, the analyzing of a well casing can be even more difficult, because of the inaccessibility of that portion of the well casing at greater depths below the earth's surface. In fact, to the best knowledge of the applicant herein, there has not been a reasonably adequate method for analyzing well casings or structures such as well casings where there are substantial problems in accessibility.

One prior art approach of analyzing the condition of various objects is time domain reflectometry, where a pulse is transmitted along the length of the member being tested, and at the location of a discontinuity, there is a reflection of the pulse which is sent back to a receiving location (which can be the location at which the pulse was transmitted). By measuring the time increment from the transmission of the pulse to the time the reflection is received, while knowing the velocity of the pulse, the location of the discontinuity can be ascertained. Also, depending on the circumstances, the character of the reflected pulse may yield information about the nature of the discontinuity. While this method has value for certain applications, to the best knowledge of the applicant, this has not proven to be an effective method of analyzing the condition of pipelines or wells.

SUMMARY OF THE INVENTION

The method and system of the present invention are arranged to detect an anomaly along a member having a lengthwise axis, and particularly where the member has a first location which is more accessible, and a second location which is less accessible, such as a well casing that extends from an upper ground location into the ground.

A first electrical pulse is sent from a first location on said axis toward a second location, with the pulse being reflected as a reflected pulse from the second location toward the first location.

Then a second pulse, synchronized with the first pulse, is sent along said axis in a direction toward said second location and toward said reflected pulse so as to cause second pulse and said reflected pulse to intersect at an intersecting location.

At least one of the reflected pulse and the second pulse after passing through the intersecting location is detected and analyzed to ascertain modifications of one of said reflected pulse and said second pulse. In the preferred form, the reflected pulse from the first pulse is detected and analyzed, but it would also be possible to detect and analyze the second pulse that is reflected.

Subsequent first and second pulses are sent along the axis, and synchronization of these is changed to cause the intersection of the reflected pulse and the second pulse to move to a second intersecting location. This pattern can be repeated so that the intersecting location is stepped along the length of the member being analyzed.

Other features will become apparent from the following detailed description.

BRIEF DESCRIPTION OF THE DRAWINGS

FIG. 1 is a somewhat schematic view illustrating a pipe and showing a simplified process of a principle of pulse propagation analysis, as applied to a pipeline;

FIG. 2 is a schematic view of the apparatus of the present invention where a member such as a well casing is analyzed;

FIG. 3 shows a wave form of a pulse transmitted to he end of a well casing and reflected back to a sensing location.

DESCRIPTION OF THE PREFERRED EMBODIMENT

It is believed that a clearer understanding of the present invention will be achieved by first describing in a rather simplified form the basic operation of the invention disclosed in U.S. Pat. No. 4,970,467, after which the present invention will be described in more detail.

Reference is now made to FIG. 1 of the accompanying drawing, this same FIG. 1 also being shown in U.S. Pat. No. 4,970,467. In FIG. 1 there is shown a length of steel pipe 10 having two end locations A and B. A first electrical pulse of short duration is imparted to the pipe 10 at location A, and at the same time a second electric pulse is imparted to the pipe at location B. On the assumption that the two pulses travel toward each other at the same rate of velocity (e.g., approximately one-half foot per nano-second), these two pulses will meet at a center location 12. It is, to be expected that as these two pulses meet, they will interact with each other in some manner, with the modified pulse from point A traveling beyond the middle point of intersection at 12 toward a receiver and analyzer 14. In like manner, the pulse emitted from point B will travel beyond the intersection 12 toward point A. There may also be patterns of reflecting wave forms at various locations along the length of the pipe 10.

Let it now be assumed that the pulse at point A is delayed by two nano-seconds relative to the time at which the pulse at point B is initiated. In this situation, the pulse at point B gets a two nano second "headstart". In that two nano-second headstart interval, the pulse B (traveling at a rate of one half foot per nano-second) will have traveled one foot farther down the pipe 10 than pulse A, so that pulse A and pulse B will intersect at a location 12a which is one half foot closer to point A than the original point of intersection 12 which is equally distant between point A and point B. The pulse A will be modified at the point of intersection and proceed on toward point B, and this modified pulse A will be detected by the receiver and analyzer 14. In like manner, by adjusting the delays of the times at which the pulses are emitted from point A and point B, the points of intersection 12, 12a, etc. can be "stepped along" the length of the pipe 10 to any location between the points A and B.

As discussed in U.S. Pat. No. 4,970,467 it was discovered that if there are certain anomalies (this term anomaly being used in a broad sense) at the point of intersection (e.g. 12 or 12a), the signature or wave form of the modified pulse after passing through the point of intersection will be different than it would be if this anomaly did not exist at the region of the intersection. It was also discovered that this particular signature would not be present if only a single pulse was generated to pass through the region of the anomaly and than to be detected by the receiver and analyzer 14.

To explain this further, let it be assumed that there is a certain anomaly in the pipe at location 12b. Let it further be assumed that a pulse is emitted from point A, but no corresponding pulse is emitted from point B. The pulse from point A will travel through the region of anomaly at 12b and arrive at the receiver and analyzer 14, and the signature of this single pulse A is recorded. Let it now be assumed that the same pulse A is transmitted from point A, but there is no anomaly at region 12b, and this same pulse reaches the receiver and the analyzer 14, with its signature being recorded. Depending upon the nature of the sort of anomaly that might exist at 12b, the nature of the anomaly may or may not be ascertainable by analyzing the form of the pulse from A, and even if it is identified, it would be difficult to determine the location of such anomaly along the length of the pipe.

However, let us take the same situation as indicated above, and let us now assume that the pulses are emitted from both points A and B at spaced time intervals, so that the point of intersection is "stepped along" the pipe 10, as described above. It was found that as the point of intersection is stepped along the pipe 10, a first signature pulse from point A passing through the point of intersection of pulses A and B will produce a certain signature at such time as the point of intersection is at an area of no anomaly. However, at such time as the point of intersection is in the region of the anomaly at 12b, then a different recognizable signature is given to the pulse A, and by comparing this modified signature with the previous signature, it can be recognized that an anomaly is present. Further, since the time interval between the transmitting of the pulses A and B can be accurately predetermined, it is then possible to recognize not only the presence of the anomaly at 12b, but also the location of the anomaly. In another sense, we can consider the pulses from points A and B intersecting to create an interference pattern. This interference pattern will have one signature when the intersecting location is at an area of no anomaly, and the intereference pattern will have a different signature when the intersecting location is at an area where there is the anomaly.

It was also pointed out in U.S. Pat. No. 4,970,467 that the method described in that patent is such that the detection of the anomalies in an underground pipe can be correlated to the measurements which would be obtained by the prior art half cell method described herein under "Background Art". Since there has already existed a vast amount of data relating to half cell analysis, this correlation opens the doors to an immense amount of analysis and data available from the half cell method without the necessity of doing all the physical work associated with the half cell method.

However, the problem of applying the teachings of U.S. Pat. No. 4,970,467 to the analysis of well casings is that the end portion of the well casing that is far into the earth is not readily accessible to have pulses transmitted therefrom. Accordingly, the subject matter of the present invention is directed toward adapting the basic teachings of U.S. Pat. No. 4,970,467 to the pulse propagation analysis of a well casing.

The apparatus 16 of the present invention is illustrated in FIG. 2. This apparatus 16 comprises a pulse generating and control means 18 which is shown in FIG. 2 comprising two pulse generators 20 and 22. (Alternatively, there could be a single dual channel pulse generator instead of the two generators 20 and 22. The output of the two pulse generators 20 and 22 are connected by a cable 24 to the top end 26 of a well casing 28.

There is a digital signal analyzer 30 which is or may be of conventional design, and is also part of the pulse generating and control means 18. This signal analyzer 30 is operatively connected to the pulse generators 20 and 22. More specifically, the signal analyzer 30 has an input terminal 31 connected by a line 32 to an output terminal 34 of the first pulse generator 20, and also an external trigger terminal 36 connected to two trigger terminals 38 and 40, respectively, of the pulse generators 20 and 22. The trigger 38 is an output trigger, and the trigger 40 is an external trigger. An output terminal 42 of the second generator connects to the aforementioned cable 24, and a line 44 connects the output terminal 42 to the line 32 connecting the signal analyzer 30 to the output terminal 34 of the pulse generator 20.

To describe the operation of the present invention, the first task is to determine the time delay length of the system and of the well casing 28 specifically. This is accomplished by transmitting a pulse from the first pulse generator 20 through the cable 24 to the upper end 26 of the well casing 28. This pulse travels down the length of the well casing 28 until it reaches the bottom end location 46 of the casing 28, where this pulse is reflected back up through the well casing 28 back through the cable 26 to arrive at the signal analyzer 30. The time interval between which the pulse was sent from the generator 20 and received at the analyzer 22 is used to calculate the length or time distance of the well casing 28 measured from the connection point of the cable 24 to the bottom end 46. This can easily be done, for example, by doubling the time distance of the cable 24 and whatever delays there are in the pulse generating and control means, and subtracting this from the total time interval of the travel of the initial pulse and the return pulse, and dividing the result by 2, this giving the time distance of the well casing 28.

To describe more specific aspects of the apparatus 16, the pulse emitted from the output terminal 34 of the pulse generator 20 is received at the terminal 31 of the signal analyzer 30. The trigger pulse from the terminal 38 of the pulse generator 20 goes to the external trigger 36 of the signal analyzer 30 to activate that signal analyzer. Also, the trigger pulse from the terminal 38 is received at the trigger terminal 40 of the pulse generator 22. Where the initial pulse from the generator 20 is simply to determine the time distance of the system, the generator 22 is set so that its output signal would be zero. Thus, the signal from the generator 20 travels to the signal analyzer and down to the end of the well casing 28 and is reflected back to the signal analyzer 30 without causing a signal from the generator 22 to be generated.

Then, when the apparatus 16 is operated to create the intersecting pulses, the pulse generated from the terminal 34 of the generator 20 is received by the signal analyzer 30 and also travels down the well casing 28 and is reflected back up from the bottom end of 46. When the pulse is emitted from 34, at the same time there is the trigger pulse emitted from the trigger terminal 38 which activates the signal analyzer 30 and also is received at the external trigger 40 of the generator 22. The time delay device on the pulse generator 22 is set at the appropriate setting so that the second pulse transmitted from the output 42 is at a precisely predetermined delay time, relative to the pulse emitted from the generator 20. To step the point of intersection along the casing 28, the delay setting of the second generator 22 is changed. This could be done manually, or this could be done by computer control.

FIG. 3 represents the wave form showing the initial pulse 48 and the reflected pulse 50, as these are recorded by the signal analyzer 30. It can be seen that the reflected pulse 50 would be of lesser amplitude than the initial pulse 48, and also possibly be modified in form.

Once the time distance of the well casing 28 has been calculated, and with the time distance it takes a pulse to make the "round trip" from the pulse generator 20 to the bottom end 46 of the well casing 28 and back to the signal analyzer 30 also being known, then the analysis of the condition of the well casing 28 can be accomplished as follows. In general, the reflected pulse 50 generated initially by the first generator 20 intersects with a second pulse sent by the second pulse generator 22 to the well casing 28. Then the timing of the pulses from the two generators 20 and 22 is coordinated so that the point of intersection is stepped along the length of the well casing 28 in generally the same manner as described previously herein relative to the method employed with the apparatus of FIG. 1.

To explain this in a more specific example, let it be assumed that the total time delay of a pulse traveling from the pulse generator 20 to the bottom end 46 of the casing 28 and back to the signal analyzer 30 is two thousand nanoseconds, and let it be assumed that the time distance of the cable 24 (plus any delays experienced in the operation of the pulse generating and control means 18) is one hundred nanoseconds. Therefore, the pulse traveling from the pulse generating and control means 18 to the top end 26 to the cover 28 is one hundred nanoseconds, and the pulse traveling from the top end 26 back to the pulse generating control means 18 is also one hundred nanoseconds.

Let it be further assumed that the analysis of the well casing 28 is to be achieved by first causing the reflected pulse traveling upwardly through the casing 28 to intersect the pulse traveling from the second generator to the casing 28 at the upper end 26 of the well casing 28. The first pulse is emitted from the first pulse generator 20, and this first pulse travels through the cable 26 downwardly along the well casing 28 and is reflected back up toward the top end 26 of the well casing 28. When this initial reflected pulse is at a time distance of one hundred nanoseconds from the top end 26 of the casing 28, a pulse from the second pulse generator 22 is transmitted into the cable 24, so that the reflected pulse and this pulse from the generator 22 intersect at the top end 26 of the wall casing 28. The reflected pulse passes through the point of intersection and travels back to the pulse generating and control means 18 where the fingerprint of this reflected pulse having passed through the intersection is recorded in the signal analyzer 30.

The next step is to step the point of pulse intersection by a certain increment down the length of the casing 28. Let it be assumed that each pulse travel a distance of about one half foot for every nanosecond, and that it is desired to step the pulse intersection locations downwardly along the casing 28 at one foot intervals. The second pulse from the generator 20 is transmitted through the cable 24 and down the casing 28 to be reflected, and when this reflected pulse is at a time distance of one hundred and four nanoseconds from the top end 26 of the casing 28, the next pulse from the second generator 22 is emitted. One hundred and two nanoseconds later, the reflected pulse and the second pulse from the second generator 22 intersect at a location down the length of the pipe two nanoseconds earlier (i.e. one foot further down the casing 28) than the location of the first intersection. This same pattern of stepping the intersection down along the length of the casing is repeated until the point of intersection approaches closely to the bottom end 46 of the casing 28.

When the point of intersection approaches a location quite close to the lower end 46 of the casing 28, it will be expected that there will be some overlap as the two pulses travel along the cable 24 and downwardly along the casing 28. For example, if the length of each of the pulses is one hundred nanoseconds, and the point of intersection is at a time distance of ten nanoseconds from the bottom end 46 of the casing 28, then the first pulse which is to be reflected would lead the second pulse by twenty nanoseconds, with there being an overlap of eighty nanoseconds. However, it has been found through various tests and analyses related to the present invention that the critical interaction of the intersecting pulses takes place when the leading edges of the two pulses meet each other. Thus, while the effect of this overlap has not been analyzed completely, it can be hypothesized with reasonable justification that this would not impose any substantial impediment to the analysis of the fingerprint or the wave form. The reason for this is that the wave forms or fingerprints are analyzed for a deviation in the wave form or fingerprint. To explain this further, if the wave form is consistent as the point of intersection is being stepped along the casing 28, it can be presumed that the character of the casing 28 is consistent along its length, and this would lead to the conclusion that there is no serious degradation of the casing 28 at any location. However, when a deviation from the norm is detected, then further analysis must be conducted to ascertain whether the deviation of the wave form indicates an undesirable anomaly or deviation.

Also, it will be noted that the reflected pulse generally has a lower amplitude (and possibly also a somewhat different wave form) than the pulse from the generator 22 which would normally be the same as the initial pulse from the generator 20. However, this should normally not constitute any substantial impediment to the analysis of the intersecting wave form to detect defects or other anomalies in the casing 28. The reason for this is that if the wave form resulting from the collision is reasonably consistent, then it can be concluded that the character of the pipeline along its length is also consistence, so that no serious defects or anomalies would exist. On the other hand, if there is a deviation from the norm, then this would indicate some sort of anomaly. Depending upon further analysis, the anomaly detected may or may not be of any great significance.

With regard to the steps to be taken in analyzing the wave forms, and what sort of defects or anomalies would relate to certain wave forms or fingerprints of the intersected pulse, reference is made first to U.S. Pat. No. 4,970,467, and also the co-pending U.S. application entitled "APPARATUS AND METHOD FOR PULSE PROPAGATION ANALYSIS" (which is being filed concurrently with the present patent application), the subject matter of both of these being incorporated herein by reference. It can be hypothesized with reasonable justification that the general principles relating to interpretation of wave forms as they relate to various defects or anomalies would relate also to the analyses that would be performed in conjunction with the method described in this patent application.

It should also be recognized that the analysis of the wave forms of the present invention may be correlated more closely to the analysis of wave forms in pipelines (as described in U.S. Pat. No. 4,970,467 and the other patent applications filed concurrently herein and incorporated by reference) by controlling or modifying the pulse emitted from the second generator 22. For example, it will be noted in examining the graph of FIG. 3 that the first pulse has a greater amplitude than the reflected pulse. Accordingly, if it is desired to make the reflected pulse be closer in amplitude and pulse width with the pulse being emitted from the second generator 22, then the second generator 22 could be adjusted to emit the pulse of the desired amplitude and width to correspond more closely to the reflected pulse. It could also be surmised that in certain situations and depending upon the limitations or capabilities of the equipment being used, the shaping of the pulse might be modified or controlled to enhance the ability to produce wave forms that would open other avenues of analysis.

In many instances, it may be desirable to correlate the analysis of the method of the present invention with pipe to soil potential readings. However, this involves difficulties, since as a practical matter the half cell would have to be moved up and down through the ground along the outside of the well, and this obviously is not practical. In above mentioned U.S. Pat. No. 4,970,467, it was indicated that the amplitude of certain portions of the intersected wave form or fingerprint shows a relationship to the pipe to soil potential readings. In the system described in U.S. Pat. No. 4,970,467, the pipe to soil potential readings which would be taken along the length of the pipeline results in readings taken where the half cell is moved along the surface of the earth above the pipeline.

With the above in mind, let us hypothesize that a series of wave forms or fingerprints of intersecting wave forms are taken at various locations down the length of the casing 28, and let it be further assumed that these are to be correlated with what would be expected to be pipe to soil potential readings if these could be taken. Analysis has indicated that the amplitude of the pipe to soil potential reading is inversely proportional to the natural log of the length of the vectors from the center of the anode to that location on the pipe. Such an anode (indicated at 60) is often used with well casings and is buried deep in the ground at a reasonable distance from the well casing. Then an electrical potential is imposed between the anode 60 and the well casing 28 to help inhibit corrosion.

Thus, with reference to FIG. 4 there are various lengths shown from L-1 through L-6. If this relationship of the pipe to soil potential readings is recognized and this is correlated to the wave forms or fingerprints achieved by the present invention, then it would be possible to correlate the fingerprints obtained from the intersecting wave forms of the present invention to the pipe to soil potential readings that would be taken with the anode at a fixed location, as shown in FIG. 2. For example, within the broader scope of the present invention, it may also prove to be of value to analyze the second pulse is emitted from the second generator which would travel to the end of the casing 28 and be reflected back to the signal analyzer 30.

Various modifications could be made to the apparatus and method described herein without departing from the basic teachings of the present invention.

What is claimed

1. A method of detecting an anomaly along a member having a lengthwise axis, said method comprising:
   a. sending a first electrical pulse from a first location on said axis toward a second location on said axis, with said pulse being reflected as a reflected pulse from said second location toward said first location;
   b. sending a second pulse, synchronized with said first pulse, along said axis in a direction toward said second location and toward said reflected pulse so as to cause said second pulse and said reflected pulse to intersect at an intersecting location;
   c. detecting and analyzing at least one of said reflected pulse and said second pulse after passing through said intersecting location to ascertain modifications of one of said reflected pulse and said second pulse wherein said anomaly is detected in response to said ascertained modifications.

2. The method as recited in claim 1, wherein said reflected pulse is detected and analyzed.

3. The method as recited in claim 1, wherein said second pulse travels to said second location and is reflected back as a second reflected pulse, and said second reflective pulse is detected and analyzed.

4. The method as recited in claim 1, wherein subsequent first and second pulses are sent along said axis, and synchronization of said subsequent first and second pulses is changed to cause said intersection of the reflected pulse and the second pulse to move to a second intersecting location, and at least one of said reflected pulse and second pulse is detected and analyzed after passing through said second intersecting location to ascertain modification in any one of said subsequent reflected pulse and second pulse.

5. The method as recited in claim 4, wherein said member has a first end more accessible to a ground surface location, and a second end which is less accessible and further away from a ground surface location.

6. The method as recited in claim 5, wherein said member is a well casing.

7. The method as recited in claim 3, wherein subsequent first and second pulses are sent along said axis, and synchronization of said subsequent first and second pulses is changed to cause said intersection of the reflected pulse and the second pulse to move to a second intersecting location, and at least one of said reflected pulse and second pulse is detected and analyzed after passing through said second intersecting location to ascertain modification in any one of said subsequent reflected pulse and second pulse.

8. The method as recited in claim 7, wherein said member has a first end more accessible to a ground surface location, and a second end which is less accessible and further away from a ground surface location.

9. The method as recited in claim 2, wherein subsequent first and second pulses are sent along said axis, and synchronization of said subsequent first and second pulses is changed to cause said intersection of the reflected pulse and the second pulse to move to a second intersecting location, and at least one of said reflected pulse and second pulse is detected and analyzed after passing through said second intersecting location to ascertain modification in any one of said subsequent reflected pulse and second pulse.

10. The method as recited in claim 9, wherein said member has a first end more accessible to a ground surface location, and a second end which is less accessible and further away from a ground surface location.

11. The method as recited in claim 1, wherein said member has a first end more accessible to a ground surface location, and a second end which is less accessible and further away from a ground surface location.

12. The method as recited in claim 1, wherein said member is a well casing.

* * * * *